United States Patent

Blincoe

[11] 4,012,644
[45] Mar. 15, 1977

[54] BLOCKING OSCILLATOR DRIVER FOR A MICROWAVE LATCHING FERRITE DEVICE

[75] Inventor: Homer P. Blincoe, Tucker, Ga.

[73] Assignee: Electromagnetic Sciences, Inc., Atlanta, Ga.

[22] Filed: Oct. 16, 1975

[21] Appl. No.: 623,007

[52] U.S. Cl. .............................. 307/275; 307/300; 307/314; 331/112

[51] Int. Cl.² ........................................ H03K 3/30

[58] Field of Search .......... 307/253, 270, 275, 314, 307/282, 300; 331/112

[56] References Cited

UNITED STATES PATENTS

| 3,047,736 | 7/1962 | Dornhoefer | 307/275 |
| 3,193,691 | 7/1965 | Akmenkalns | 307/270 |
| 3,239,681 | 3/1966 | Bond | 307/275 |
| 3,754,274 | 8/1973 | Auger | 307/270 |

Primary Examiner—Stanley D. Miller, Jr.
Assistant Examiner—B. P. Davis
Attorney, Agent, or Firm—Cushman, Darby & Cushman

[57] ABSTRACT

A microwave latching ferrite device is provided of the type associated with microwave transmission lines for effecting a phase shift or switching of the microwave signal being propagated. Driving means is provided for a latch winding of the ferrite device in the form of a blocking oscillator coupled between an input and the latch winding. The blocking oscillator includes a power transistor and a toroidal transformer coupled thereto. In response to a trigger pulse on the input, the blocking oscillator generates a single latch pulse on the latch winding, which is effective to change the degree of magnetization of the microwave ferrite device.

7 Claims, 9 Drawing Figures

BLOCKING OSCILLATOR DRIVER FOR A MICROWAVE LATCHING FERRITE DEVICE

BACKGROUND OF THE INVENTION

This invention pertains to drives for ferrite materials used to load microwave transmission lines and more particularly pertains to a blocking oscillator drive for such transmission lines.

Ferrite materials have been used to load waveguide, stripline and coaxial transmission lines for a considerable length of time. At first, the magnetic fields required by the ferrite materials to produce the desired effects were maintained by fixed external magnets. Some degree of temperature compensation in such an external magnet system was obtained by using pole pieces with the proper change of reluctance with temperature to strengthen or weaken the magnetic field as required with temperature changes.

Later, the advantages that could be obtained by quickly changing the magnetic field were realized, and various arrangements for doing so were developed. One way that this was done was to still utilize fields from magnets outside the transmission line structure, but substituting electromagnets in place of permanent magnets. These electromagnets were made of laminated silicon iron or of ferrite and powdered iron for higher frequency applications. One problem with such arrangements was that the eddy currents generated in the metal structure of the transmission line made it difficult to achieve switching speeds faster than about one millisecond.

The slow speed, and generally bulky and power-consuming equipment required for this external electromagnet configuration was overcome when it was discovered that it was possible to arrange the core in a closed toroidal configuration completely within the transmission line structure. This proved to be possible and practicable despite the fact that the fields in the core were no longer in one simple direction with respect to the passing signal wave, but had some components in all directions, and the magnitude of the fields varied much more through the toroid.

This new arrangement of a closed toroidal configuration resulted in a requirement for a small switching circuit to match the more compact overall structure. Since the winding must now be within the microwave pathway, it was necessary to keep it as simple as possible with as few number of turns as possible. In many cases two turns is almost the maximum possible. This low number of turns made it necessary for the switch to handle large currents to produce the required magnetic field, with 10 amps being typical.

Several different types of control circuits have been employed in the past to produce the very fast, high current and moderate voltage pulses desired to change the direction of the magnetic fields in the closed toroidal configuration. In one of these arrangements, an SCR is utilized to discharge a capacitor (or possibly a length of lumped constant transmission line). The problem with this approach is that the SCR is difficult to cut off, and there is a need to break off the current after the desired degree of magnetization is reached. This level is reached before the supply of current is exhausted, or certainly before the system energy is expended. The result is that there is a long decaying tail of current which prevents the core from settling to its correct rest state until the current is low enough, or else an involved circuit is required in order to cut off the SCR. The tendency is for such a system to be somewhat complex and slow.

Other prior art approaches have utilized a power transistor to turn on and break off the required current. The pulse used to control the transistor is usually a fixed length pulse, generated either internally or externally by a control system.

It should be appreciated that the current required to produce the desired magnetic field is large and that the winding on the toroidal core goes through impedance changes during switching, constituting somewhat of a nonlinear load. Since it is desired that the current build up quickly and cut off quickly, it is advantageous to have the main switch for the current, as well as the source of current, located right at the microwave device.

When the toroid is magnetized, the degree of magnetization determines either the differential phase shift produced in a phase shifter, or the exactness with which a junction circulator directs its energy into the desired path, so that precise control over the degree of magnetization is desirable. The degree of magnetization is determined not only by the exciting magnetic field due to the current, but by the internal structure and characteristics of the toroid material as well as by the temperature of the material.

Even the results of applying a given voltage pulse to a winding of the toroid (referred to as a "latch" winding) can produce a variety of results depending upon the magnitude of the voltage pulse and the length of time it is applied due to the non linearity of the latch wire's apparent impedance.

Under laboratory conditions, when the size and complexity of the associated equipment is of no importance, it is possible to plot the size of the voltage pulse required to produce the desired degree of magnetization in the form of a volt time product to maintain the desired performance over a wide variety of temperatures. Then, using a transistor driven by a precisely controlled pulse, which can be obtained from a well compensated monostable oscillator in integrated circuit form, a fairly constant voltage-time pulse can be obtained. The resulting circuit is, however, somewhat complicated because the monostable oscillator must be amplified without picking up width changes, and such a circuit usually does not have good amplitude accuracy, so some additional circuitry must be included to hold the base drive level constant. With respect to holding the base drive level constant, it is well known that a transistor switch should ignore base drive changes in level if it is saturated, but this is true only to a degree. This is one problem.

An additional problem in using a power transistor to switch on and off the current is the storage time of the transistor. This storage time tends to be quite temperature dependent in just the wrong direction; the on time of the transistor tends to shorten as the temperature decreases, just when it would be desired to have it remain the same or slightly increase. There are several well known techniques that can be used to minimize the storage time problem. These include applying reverse base voltage, holding the collector just short of saturation, or using transistors which inherently have a minimum amount of storage time. All these approaches, however, tend to complicate and increase the cost of the circuit considerably. Cost and complexity are very real considerations, especially for applications such as a no moving parts type of scanning antenna where hundreds of phase shifters are required.

There are other types of temperature compensation that could be used. An obvious one is temperature control of the device and/or the overall environment, but this is not always feasible or possible. Another approach is to change the voltage — time latch wire pulse by using a temperature sensing element to vary the supply voltage or the width of the base drive pulse. This is quite costly and complex to implement because the variation of the storage time is not particularly predictable due to variations in the microwave ferrite core.

OBJECTS AND SUMMARY OF THE INVENTION

Accordingly, it is an object of this invention to provide a circuit for driving a ferrite core load associated with a microwave transmission line.

It is a more specific object of this invention to provide such a driver circuit which includes a power transistor, and in which storage time effects and temperature variation effects are minimized.

It is another object of this invention to provide such a driver circuit utilizing a blocking oscillator.

Briefly, in accordance with one embodiment of the invention a microwave latching ferrite device is provided with a latch winding. Driving means is provided for the latch winding in the form of a blocking oscillator coupled between an input and the latch winding. In response to a trigger pulse on the input, the blocking oscillator generates a single latch pulse on the latch winding, which is effective to change the degree of magnetization of the microwave ferrite device.

DESCRIPTION OF THE PREFERRED EMBODIMENTS

Figure 1:
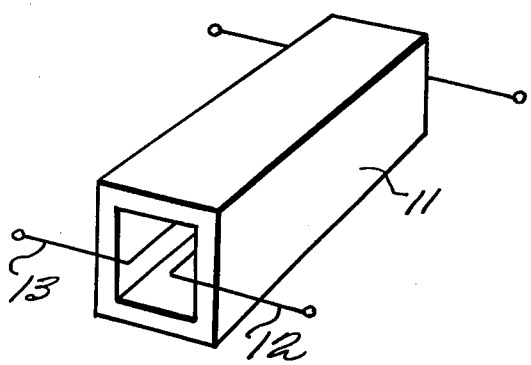
FIG. 1 is a diagrammatic view of one type of microwave latching ferrite device useful, for example, as a microwave phase shifter.

Turning now to the drawings, FIG. 1 is an illustration of one type of waveguide ferrite device. The ferrite device comprises a toroid of ferrite material 11 having latch wires 12 and 13 extending there through. The latch wires 12 and 13 are coupled to external circuitry and by suitably pulsing the latch wires the direction of magnetization of the ferrite toroid 11 can be reversed.

Figure 2:
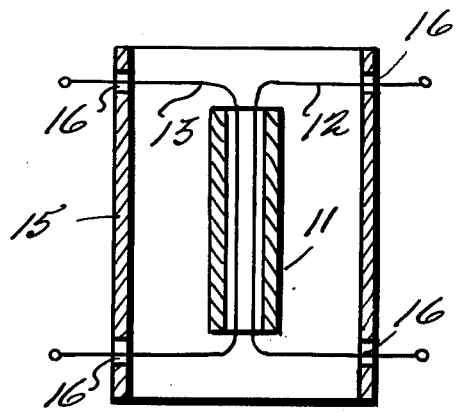
FIG. 2 is a diagrammatic view showing a section of a typical waveguide with the ferrite device of FIG. 1 in place.

The ferrite device of FIG. 1 is useful as one type of microwave phase shifter. FIG. 2 is the cross section of a waveguide showing the ferrite device of FIG. 1 in place. The latch wires 12 and 13 extend respectively through the walls 14 and 15 of the waveguide and are suitably electrically insulated therefrom by insulators 16. As the microwave signal is propagated down the waveguide the strength of the stationary magnetic field within the ferrite produces a phase shift in addition to the normal phase shift of the microwave signal passing through the waveguide length. When the direction of the magnetization is reversed, the phase per unit length is reduced, producing a net differential phase shift.

Figure 3:
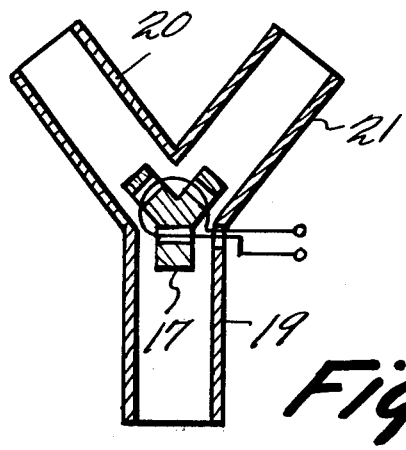
FIG. 3 is a diagrammatic view of another type of microwave latching ferrite device useful, for example, as a microwave junction circulator.

FIG. 3 is an illustration of another type of ferrite device useful in microwave transmission lines. This device is a "wye" junction circulator and comprises a ferrite three-legged core 17, with each of its three legs having an aperture and a latch wire 18 passing through the aperture in each of the three legs.

Figure 4:
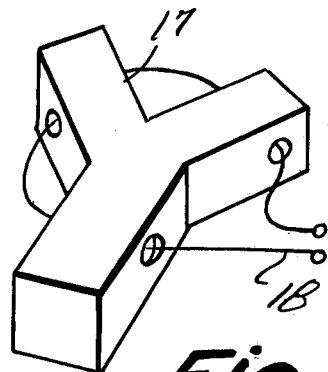
FIG. 4 is a diagrammatic view showing a microwave waveguide wye section with the ferrite device of FIG. 3 in place.

FIG. 4 illustrates the wye junction circulator 17 in place at a "tee" junction in a waveguide. Normally, without any kind of matching compensation, a signal passing down the waveguide length 19 would be crudely split into the waveguide lengths 20 and 21 with a two to one mismatch. With the presence, however, of the ferrite junction circulator 17 and with it magnetized properly, the energy passing down waveguide length 19 ignores one of the paths 20 and 21 and passes into the other with a fairly good match. The degree to which this occurs depends, of course, upon many matching factors, with it being particularly dependent upon the state of magnetization of the core at any one particular frequency. When very good performance is required over a wide temperature range, such as $-20°$ C to $+55°$ C with better than 25db isolation of the undesired port, the magnetization becomes one of the major problems. That is, it is necessary to have a driver circuit for the junction which automatically adjusts itself to switch the core the right amount at the particular operating temperature.

Figure 5:
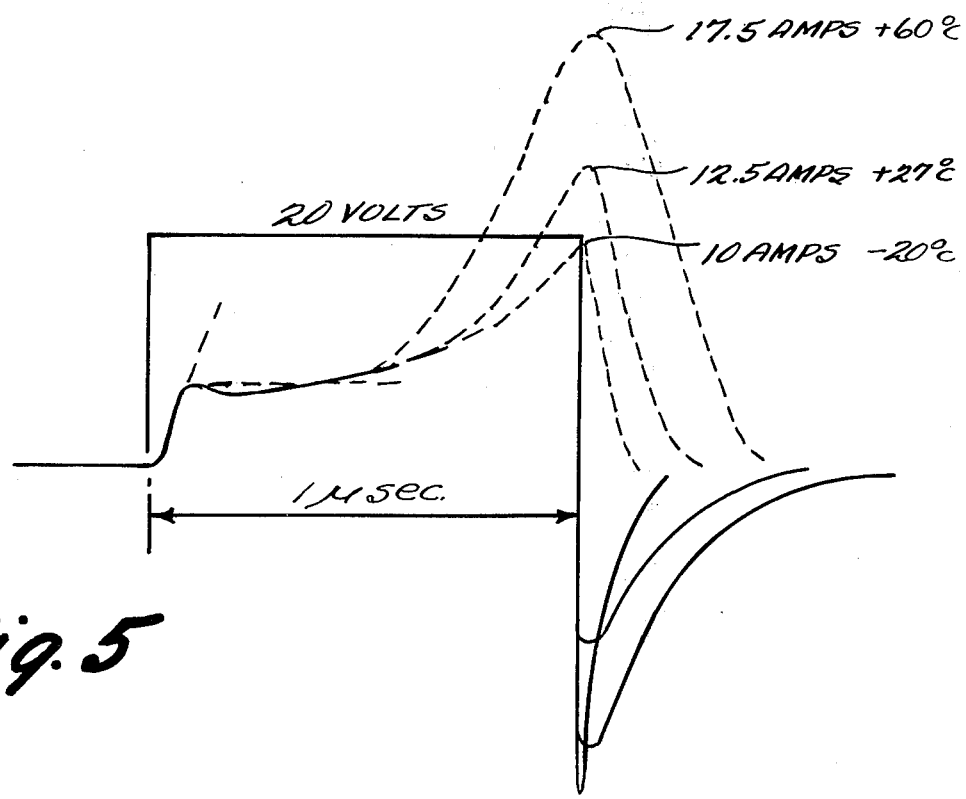
FIG. 5 is a graph showing the various current responses on a latch wire with a constant volt-time driving pulse at various temperatures.

With respect to temperature variations, providing a constant volt-time period pulse on the latch wire core is not sufficient. The apparent impedance of the latch wire is nonlinear and is subject to a variation with the temperature. Referring to FIG. 5, there is a graph illustrating the nonlinear impedance of the latch wire and its variation with temperature. In FIG. 5, the solid line represents an idealized 20 volt pulse supplied for one microsecond to a latch wire. The dashed lines illustrate current flowing through the latch wire in response to this constant volt-time period pulse, at different temperatures. As can be seen from the dotted lines, the variation with temperature is quite pronounced. Thus the resulting current at $-20°$ C is 10 amps and the resulting current at $60°$ C is 17.5 amps.

As previously mentioned, one solution would be to control the temperature of the ferrite device and the overall environment. This is not always possible, however, Another approach would be to change the voltage-time latch wire pulse by using a temperature sensing element to vary the supplied voltage or the width of the pulse. As previously mentioned, this is costly to set up.

Figure 6:
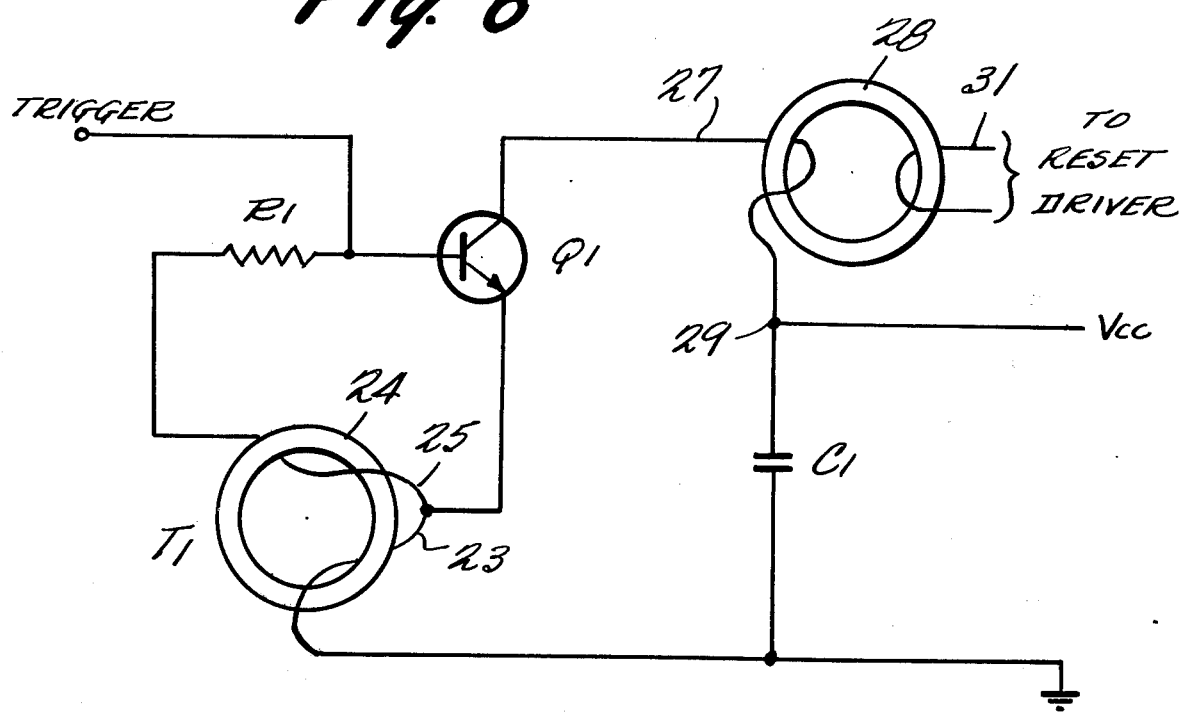
FIG. 6 is a circuit diagram of one embodiment of the invention.
Figure 7:
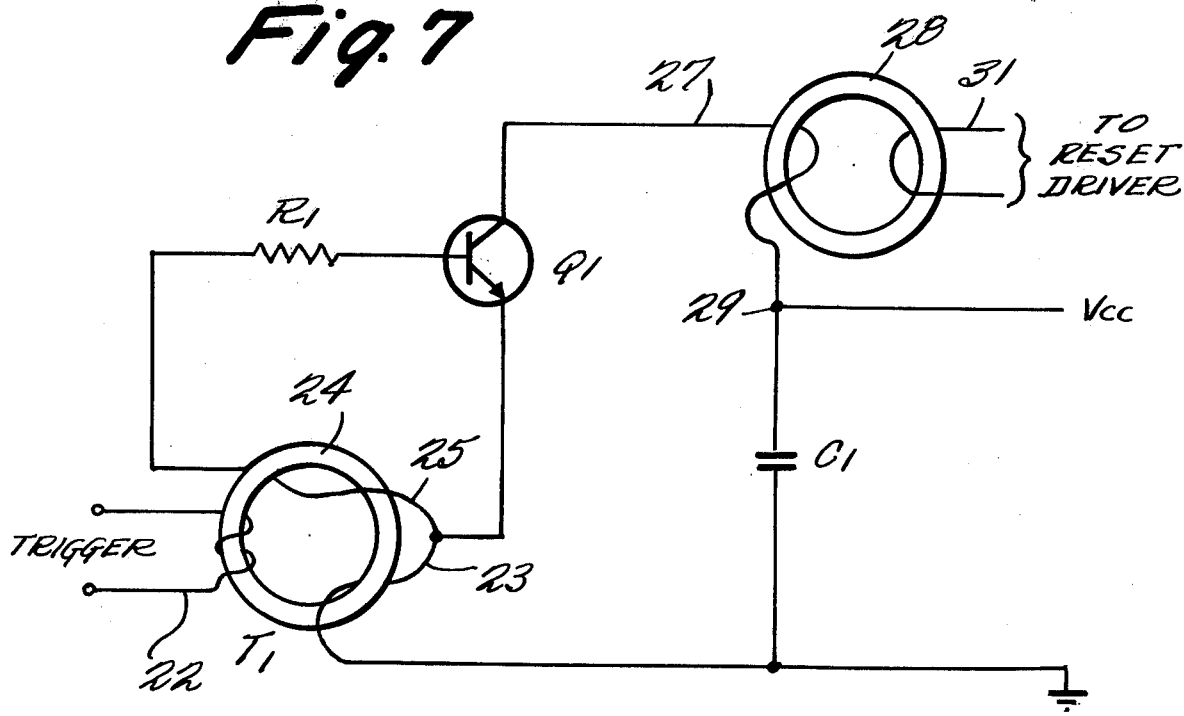
FIG. 7 is a circuit diagram of another embodiment of the invention.

Turning now to a consideration of FIG. 6, there is shown a circuit diagram in accordance with this invention in which a blocking oscillator is used in combination with a closed path ferrite core for latching the same which affects either the phase or direction of the microwave energy. The embodiments of the invention shown in FIGS. 6 and 7 are identical except for the manner in which a trigger pulse is applied, so that the two drawing figures will be discussed simultaneously. A trigger pulse is applied either directly to the base of a transistor Q1 as shown in FIG. 6, or to a secondary winding 22 provided on a transformer core T1. The trigger pulse should be sufficient to put transistor Q1 into conduction, but should be of a shorter duration than the pulse desired in the collector of transistor Q1. Typically, a pulse having a duration of 50 nanoseconds is sufficient. As transistor Q1 goes into conduction, the resulting current from the emitter of Q1 passing through conductor 23 generates a magnetic field in the core 24 of T1. The magnetic field in the core of T1, in turn, generates a voltage on conductor 25 passing through the core 24, which voltage is supplied through a resistor R1 connected between the base and emitter of transistor Q1. This voltage is in such a direction as to supply base drive to transistor Q1. This base drive is much stronger than the initial drive, and transistor Q1 switches completely into a low resistance state. The collector of transistor Q1 is connected to a latch wire 27 which loops through the ferrite core 28 to a voltage source terminal 29. A supply voltage $V_{cc}$ is connected to the voltage source terminal 29 and a capacitor C1 is connected between the voltage source terminal 29 and ground. The capacitor C1 may be, for example, a tantalum storage capacitor which acts as a constant voltage source during the time the transistor Q1 is conducting.

The length of time that transistor Q1 remains in conduction depends upon the turns ratio of the transformer T1, the core material of T1, and the characteristics of transistor Q1. The principle factor controlling the on time of transistor Q1 is the time that the current can be built up in transformer T1 to a point that will saturate its core 24. Only that part of the emitter current that is not cancelled by the base current affects the core. This is because the conductor 23 and the conductor 25 encircle the core in opposite directions. The base-emitter path acts like a loaded secondary with the common to emitter winding being the primary.

When the core 24 is saturated, the transformer action is greatly reduced due to the drop in permeability of the saturating core. Depending upon the core utilized, a range of 50 to 1 change in voltage of the secondary can be obtained. Since the induced voltage when the core is saturated is far too low to continue supplying drive to the base of transistor Q1, the transistor Q1 begins to increase in voltage drop. As transistor Q1 begins to increase in voltage drop the current in the primary of T1, conductor 23, begins to drop. Once this action begins, an actual reverse voltage is generated on the base of transistor Q1 and the transistor Q1 is rapidly cut off.

The rapid cut off action of transistor Q1 is particularly useful in the case where the transistor is of the bipolar type, as such transistors tend to have a storage time which can only be shortened by forcing a reverse base current in the base emitter circuit. Since storage time is a factor of temperature and of the variable characteristics of different transistors from the same production run, it is not a tightly controlled parameter and is a major cause of changes in dwell time. The storage time effect is particularly important in the application of driving ferrite cores, because the current required is very large relative to the size of the transistor employed. Thus in the arrangement of FIGS. 6 and 7, the current pulse applied on latch wire 27 can be on the order of 25 amps. Low duty factor makes possible the use of a relatively small transistor, such as a 2N3878 power transistor.

Not only does the action of the transformer T1 greatly reduce the storage time problem involved with the switching transistor, the transformer T1 also supplies a very good impedance match from the transistor base circuit to its emitter circuit, thus allowing a very strong base drive to be supplied for switching Q1 into a very low resistance condition. The gain variations of transistor Q1 are masked by the strong feedback that transformer T1 supplies, so that the dwell time is controlled chiefly by the transformer T1. A transformer T1, or more specifically the core 24 thereof, is relatively easy to fabricate so that its characteristics are stable over a wide range of temperatures and of manufacturing conditions.

The material and dimensions of the ferrite core and the transformer T1 can of course vary, depending upon the particular application. In accordance with one particular embodiment of the invention, the microwave ferrite core is made of a material known as G1002, of the type made by Trans Tech Corporation, and the core of the blocking oscillator (transformer T1) is made of a type material known as MN-60, of the type manufactured by Cer Mag Corporation. The transformer core in accordance with this particular embodiment has an outer diameter of 0.50 inches, an inner diameter of 0.25 inches, and a thickness of 0.3 inches.

It has also been discovered that properly selected composite ferrite cores in the blocking oscillator may very effectively compensate for undesired variations caused by changes in other parameters within the overall structure. For instance, higher temperatures may tend to result in longer transistor storage time or may degrade microwave ferrite core performance thereby tending to increase the driving current supplied by the blocking oscillator. However, by fabricating the ferrite core 24 partly from a ferrite having a low curie temperature (e.g. TT-414), this tendency may be effectively cancelled since such material is effectively removed from the magnetic circuit of core 24 under higher temperature conditions. Other parameter changes such as changes in the waveguide dimensions with temperature, etc. may also be compensated in this manner as may parameter changes which are non-linear or bell-shaped, etc. The present preferred embodiment of composite core comprises a stacked plurality of rings wherein the various rings may be fabricated from different magnetic ferrite materials and comprise desired percentages of the overall composite core as should now be appreciated.

The loading in the collector, i.e. the latch wire 27, is a highly non-linear load, consisting of a single length of conductor passing through the center of the magnetic ferrite loop or toroid 28 that is to be magnetically switched. Generally, the collector of transistor Q1 does not dip down to the emitter sufficiently low to represent a deeply saturated condition, so that the effect of the load tends not to effect the blocking oscillator action of the base-emitter circuit.

Of course, in the arrangement shown in FIGS. 6 and 7, the ferrite core 28 is provided with an additional latch winding 31 which can be connected to a driver circuit similar to the one specifically indicated for resetting the ferrite core.

Figure 8:
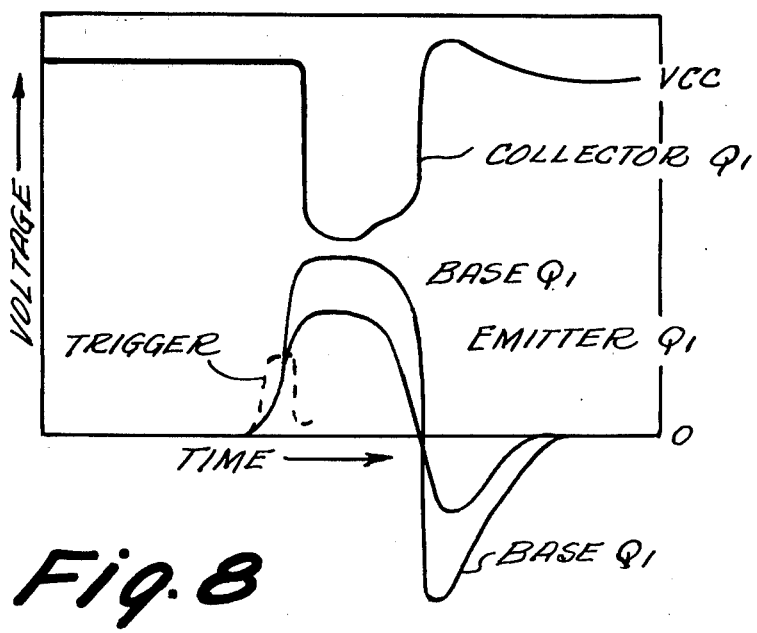
FIG. 8 is a graph of various voltage relationships in the circuits of FIGS. 6 and 7.

FIG. 8 is a graph of the various voltage relationships on the transistor Q1 during switching thereof as described above, and illustrates the manner in which, by the action of transformer T1, an actual reverse voltage is applied to the base of transistor Q1 so as to rapidly cut off the transistor.

Figure 9:
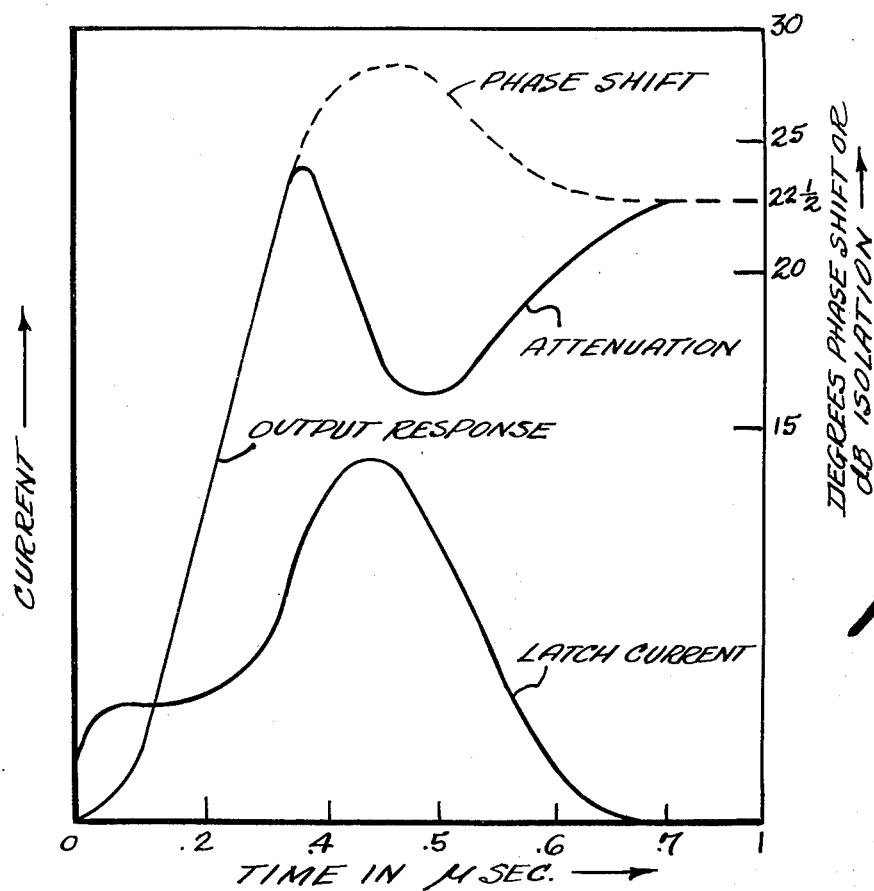
FIG. 9 is a graph of the current through the ferrite core of FIG. 6 and FIG. 7 and showing the output effect of switching the magnetic field of the core in terms of either phase shift or attenuation.

Turning now to FIG. 9, there is shown a graph of the output current response through the latch wire 27 in response to action of the blocking oscillator of FIGS. 6 and 7. The latch current rises very rapidly and can reach a peak on the order of 25 amps, for example; and, as shown in the FIG. 9, the transistor is rapidly cut off. FIG. 9 also shows the output response in terms of either phase shift or attenuation due to change of magnetization of the ferrite core 28 in response to the latch current. It can be readily seen from inspection of FIG. 9 that the advantage of cutting off the current pulse rapidly is that the ferrite core settles rapidly to its specified performance level.

In accordance with conventional good engineering practices the preferred embodiment of this invention includes voltage protection diodes between the base-emitter leads of the oscillator power transistor so as to prevent excessive reverse voltages from appearing thereacross. Also, a damping resistor is preferably used across the winding of the blocking oscillator ferrite core so as to reduce the circuit sensitivity to accidental triggering such as might conceivably occur when the opposite side operates. Further, it has been found necessary to include a series RC damping network connected across the latch wire winding itself so as to prevent excessive voltage from appearing on the transistor collector in the case of very rapid current cutoff such as may be produced by the blocking oscillator circuitry.

Thus what has been described and what forms the invention is a blocking oscillator in combination with a ferrite core of the type used for effecting phase shifts or attenuation in microwave transmission lines. The invention has been specifically shown and described in connection with a waveguide type of microwave transmission line. This has been by way of example only. As known to those working in this art, ferrite cores are utilized as phase shifters and circulators in all types of microwave transmission lines, e.g. including striplines and coaxial transmission lines, and this invention is equally applicable to such configurations. It is considered to be well within the skill of those versed in this art to provide these and other modifications which do not depart from the true spirit and scope of the invention.

What is claimed is:

1. In combination, a microwave latching ferrite device having a latch winding having first and second terminals and driving means for said ferrite device, said driving means comprising an emitter coupled blocking oscillator coupled between an input and said latch winding first and second terminals, said emitter coupled blocking oscillator comprising a switching transistor and a transformer having a toroidal core, a primary and a secondary winding, said primary winding coupled between the emitter of said switching transistor and said latch winding second terminal, and said secondary winding coupled between the emitter and base of said switching transistor, the collector of said switching transistor being coupled to said latch winding first terminal, said emitter coupled blocking oscillator generating a single latch pulse on said latch winding in response to a trigger pulse on said input with said single latch pulse being rapidly cut off due to saturation of said transformer toroidal core, thereby substantially eliminating variations in the latch pulse due to storage time variations of the switching transistor.

2. The combination of claim 1 wherein said primary and secondary windings are wound in opposite directions on said transformer toroidal core.

3. The combination of claim 1 wherein said input is coupled directly to the base of said switching transistor.

4. The combination of claim 1 wherein there is provided an additional input winding on said transformer toroidal core, and said input is connected to said input winding.

5. The combination of claim 1 wherein said microwave latching ferrite device includes a reset winding and further including additional driving means for said reset winding.

6. The combination of claim 1 wherein:
said emitter coupled blocking oscillator comprises a switching transistor and a transformer having a toroidal core with windings thereon in circuit with said transistor and with said latch winding, and
said toroidal core comprises a stacked plurality of generally toroidal rings having different magnetic characteristics.

7. The combination of claim 6 wherein:
at least one of said rings has a curie point temperature different from that of at least one other of said rings.

* * * * *